United States Patent
Ru et al.

(10) Patent No.: US 8,606,210 B2
(45) Date of Patent: Dec. 10, 2013

(54) POLYPHASE HARMONIC REJECTION MIXER

(75) Inventors: Zhiyu Ru, Enschede (NL); Eric A. M. Klumperink, Lichtenvoorde (NL); Bram Nauta, Borne (NL); Johannes H. A. Brekelmans, Nederweert (NL)

(73) Assignee: NXP, B.V., Eindhoven (NL)

( * ) Notice: Subject to any disclaimer, the term of this patent is extended or adjusted under 35 U.S.C. 154(b) by 115 days.

(21) Appl. No.: 13/147,779

(22) PCT Filed: Feb. 3, 2010

(86) PCT No.: PCT/IB2010/050483
§ 371 (c)(1),
(2), (4) Date: Aug. 3, 2011

(87) PCT Pub. No.: WO2010/089700
PCT Pub. Date: Aug. 12, 2010

(65) Prior Publication Data
US 2011/0298521 A1    Dec. 8, 2011

(30) Foreign Application Priority Data
Feb. 4, 2009 (EP) .................................. 09100095

(51) Int. Cl.
*H04B 1/26* (2006.01)
(52) U.S. Cl.
USPC ........... 455/323; 455/285; 455/302; 455/280; 455/284; 455/293
(58) Field of Classification Search
USPC ............... 455/323, 285, 302, 280, 284, 293
See application file for complete search history.

(56) References Cited

U.S. PATENT DOCUMENTS

| | | | |
|---|---|---|---|
| 7,190,943 B2 | 3/2007 | Davis | |
| 7,519,348 B2 * | 4/2009 | Shah | 455/285 |
| 2010/0019681 A1 | 1/2010 | Deixler et al. | |
| 2010/0253412 A1 | 10/2010 | Brekelmans et al. | |
| 2010/0283526 A1 | 11/2010 | van Sinderen et al. | |

FOREIGN PATENT DOCUMENTS

| | | |
|---|---|---|
| CN | 101262240 A | 9/2008 |
| WO | 2005/091493 A1 | 9/2005 |
| WO | 2009/006189 A2 | 1/2009 |

OTHER PUBLICATIONS

Weldon, J. et al. "A 1.75GHz Highly-Integrated Narrow-Band CMOS Transmitter with Harmonic-Rejection Mixers", 2011 IEEE Int'l. Solid-State Circuits Conf., 160-161, 442 (Feb. 2001).
Weldon, J. "High Performance CMOS Transmitters for Wireless Communications," thesis, Univ. of Cal., Berkeley, 245 pgs. (2005).

(Continued)

*Primary Examiner* — Sanh Phu

(57) ABSTRACT

A polyphase harmonic rejection mixer, comprising a plurality of stages following each other; wherein a first stage is arranged to perform at least frequency conversion; and a second stage is arranged to perform at least selective weighting and combining; wherein at least two of the plurality of stages are arranged to perform at least combining. In an embodiment, the first stage (28) comprises three single-ended gain blocks (10, 12, 14), arranged to perform selective weighting, frequency conversion and combining; and a second stage (30) following the first stage (28) and arranged to perform selective weighting and combining. The second stage (30) may reduce the number of phases output by the first stage (28) and may output (32) a complex differential down converted signal. The mixer may be directly interfaced to an antenna of an LNA-less receiver without weighting in the first stage. The mixer may be included in a software-defined radio.

16 Claims, 9 Drawing Sheets

(56) References Cited

OTHER PUBLICATIONS

Bagheri, R. et al. "An 800MHz to 5GHz Software-Defined Radio Receiver in 90nm CMOS", 2006 IEEE Int'l. Solid-State Circuits Conf., 10 pgs. (Feb. 2006).

Craninckx, J. et al. "A Fully Reconfigurable Software-Defined Radio Transceiver in 0.13μm CMOS", 2007 IEEE Int'l. Solid-State Circuits Conf., pp. 346-347, 607 (Feb. 2007).

Hyouk-Kyu, C. et al. "A CMOS Harmonic Rejection Mixer With Mismatch Calibration Circuitry for Digital TV Tuner Applications", IEEE Microwave and Wireless Components Letters, vol. 18, No. 19, pp. 617-619 (Sep. 2008).

Moseley, N. et al. "Experimental Verification of a Harmonic-Rejection Mixing Concept Using Blind Interference Canceling", Proc. $1^{st}$ European Wireless Techn. Conf., pp. 210-213 (Oct. 2008).

Ru, Z. et al. "A Discrete-Time Mixing Receiver Architecture with Wideband Harmonic Rejection," 2008 IEEE Int'l. Solid-State Circuits Conf., pp. 322-323, 616 (2008).

Ru, Z. et al. "A Software-Defined Radio Receiver Architecture Robust to Out-of-Band Interference", 2009 IEEE Int'l Solid-State Circuits Conf., pp. 230-231, 231a (2009).

International Search Report and Written Opinion for Int'l Patent Appln. No. PCT/IB2010/050483 (7-62010).

* cited by examiner $$s(t) = \frac{4}{\pi}\left(\cos\omega t - \tfrac{1}{3}\cos 3\omega t + \tfrac{1}{5}\cos 5\omega t - \cdots\right)$$

POLYPHASE HARMONIC REJECTION MIXER

The present invention relates to polyphase harmonic rejection mixers and their operation. The present invention is particularly suited to, but not limited to, polyphase harmonic rejection mixers for use in wideband radio transceivers such as software-defined radio.

Harmonic rejection (HR) mixers allow a saving on radio frequency (RF) band-filtering to be made, for example in software-defined radio (SDR). Common implementations of HR mixers use a weighted combination of hard-switching mixers that need careful alignment of phase and gain parameters.

Switching mixers with rejection properties on one or more odd higher harmonics, also known as harmonic rejection (HR) mixers, are increasingly being used, especially in so called software defined radio. Frequency up or down conversion with a HR mixer enables a saving on RF filtering. Usually a HR mixer uses a weighted combination of hard-switching sub-mixers. The sub-mixers can be of the active (e.g. Gilbert) type or of the passive switching type.

The weighted combining of hard-switching mixers effectively creates a sinusoid-like mixing waveform. FIG. 1 gives a schematic example of a conventional HR mixer suppressing the 3rd and 5th harmonic and FIG. 2 shows the associated mixing waveforms of such a conventional HR mixer created by a weighted addition of 3 hard-switching mixer outputs.

To achieve a high amount of harmonic rejection ratio (HRR) requires careful alignment of the phase and amplitude of the segment contributions, as illustrated schematically in FIG. 1. Vice-versa this makes HR mixers susceptible to gain and phase mismatch. Phase and gain mismatch can be caused by process, voltage, and temperature (PVT) variations. In practical implementations of HR mixers the achievable HRR is usually limited to 30 to 40 dBc. To guarantee HRR beyond this range often needs a calibration.

Harmonic rejection mixer operation can be understood from the frequency spectrum of the resulting mixing waveform. Three rectangular signals p2, p0 and p1 together make up the mixing waveform, and are each phase shifted 45° and have amplitudes 1, $\sqrt{2}$ and 1 respectively, as shown in FIG. 2. The rectangular signals each comprise a fundamental tone plus a large number of odd higher harmonics as illustrated by FIG. 3 showing a unity amplitude square wave (indicated by reference numeral 2) and its frequency content (indicated by reference numeral 4). The vector contributions of $1^{st}$, $3^{rd}$, $5^{th}$, and $7^{th}$ harmonics (shown in Tables 1a and 1b below), show how the different segment responses at the 3rd and 5th harmonic will cancel each other. In the presence of phase or amplitude errors the cancellation will not be perfect, as shown in FIG. 4, where FIG. 4 shows third harmonic rejection as a function of gain and phase error applied to signal p0 in FIG. 2.

TABLE 1a

| | Amplitude | | | |
|---|---|---|---|---|
| | 1 | 3 | 5 | 7 |
| p2 | 1 | 1/3 | 1/5 | 1/7 |
| p0 | $\sqrt{2}$ | $\sqrt{2}/3$ | $\sqrt{2}/5$ | $\sqrt{2}/7$ |
| p1 | 1 | 1/3 | 1/5 | 1/7 |

TABLE 1b

| | Phase | | | |
|---|---|---|---|---|
| | 1 | 3 | 5 | 7 |
| p2 | −45 | −135 | −225 | −315 |
| p0 | 0 | 0 | 0 | 0 |
| p1 | 45 | 135 | 225 | 315 |

The present inventors have realized that it would be desirable to reduce the susceptibility of the mixer to the gain mismatch.

In a first aspect, the present invention provides a polyphase harmonic rejection mixer, comprising: a plurality of stages following each other; wherein a first stage is arranged to perform at least frequency conversion; and a second stage is arranged to perform at least selective weighting and combining; wherein at least two of the plurality of stages are arranged to perform at least combining.

The polyphase harmonic rejection mixer may comprise one or more further stages, each further stage being arranged to perform selective weighting and combining.

The first stage may be further arranged to perform combining in addition to frequency conversion.

The first stage may be further arranged to perform selective weighting in addition to frequency conversion and combining.

A following stage may be arranged to reduce the number of phases output by its preceding stage.

The final stage may be arranged to output a complex differential down converted signal.

The frequency conversion may be implemented by mixers or samplers.

The combining may be implemented by resistance or transimpedance or digital blocks.

The selective weighting in one or more of the stages may be implemented by resistance or transconductance or digital blocks.

The selective weighting in at least one stage may be implemented by plural gain blocks.

The gain blocks may be single-ended or differential.

Each gain block may drive a respective set of plural mixers or samplers.

In a further aspect, the present invention provides an LNA-less receiver comprising an antenna directly interfaced to a polyphase harmonic rejection mixer according to any of the above aspects.

In a further aspect, the present invention provides a software-defined radio comprising a polyphase harmonic rejection mixer according to any of the above aspects.

In a further aspect, the present invention provides a method of polyphase harmonic rejection mixing, the method comprising: a first stage performing at least frequency conversion; and a second stage performing at least selective weighting and combining; wherein at least two stages perform at least combining.

The method may further comprise one or more further stages each performing selective weighting and combining.

A following stage may reduce the number of phases output by its preceding stage.

Embodiments of the present invention will now be described, by way of non-limiting example only, and with reference to the accompanying drawings, in which:

FIG. 1 schematically illustrates a conventional HR mixer that requires three LO phases;

Figure 9:
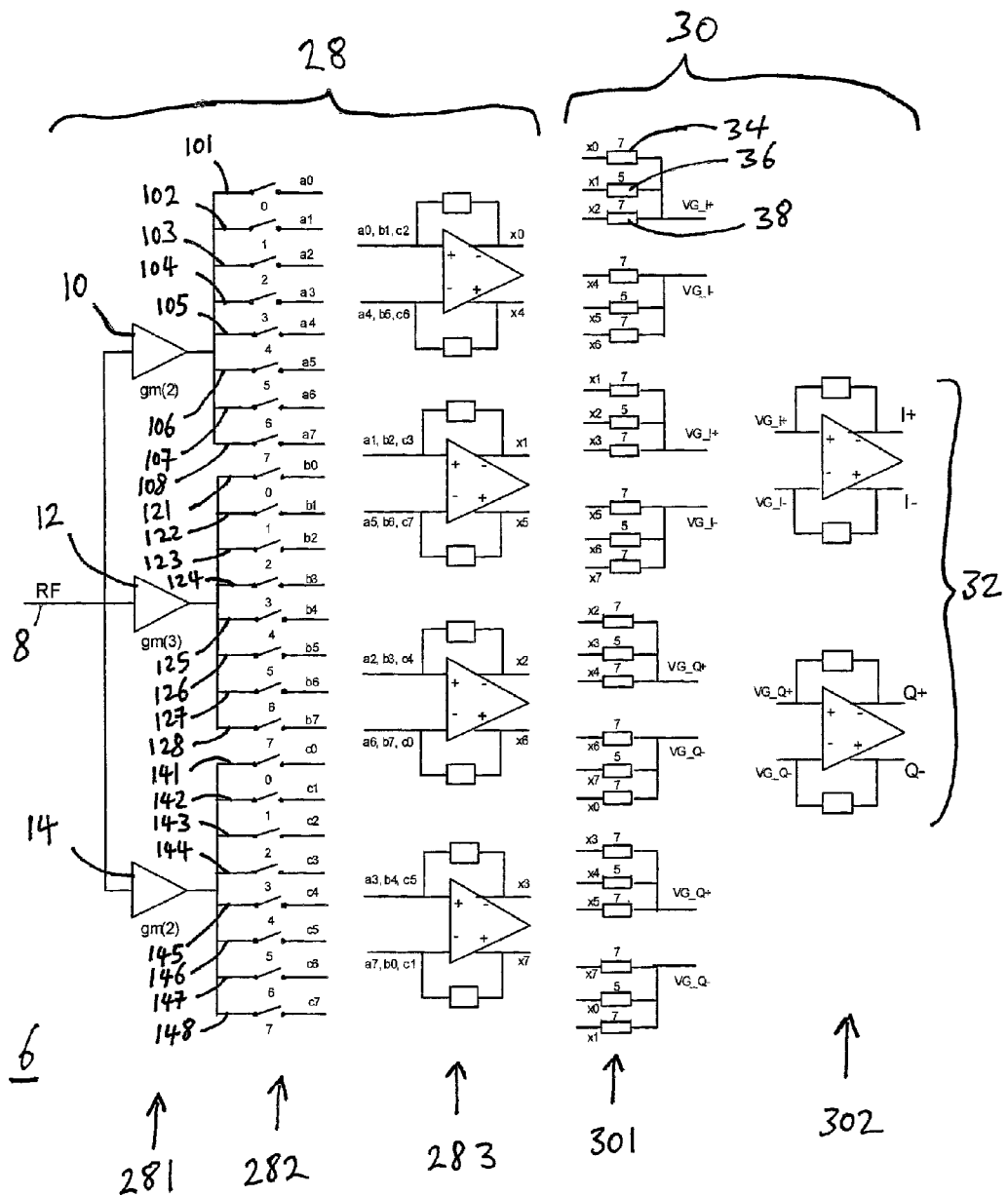
FIG. 9 is a schematic illustration of an embodiment of a complex multi-stage polyphase HR mixer.
Figure 10:
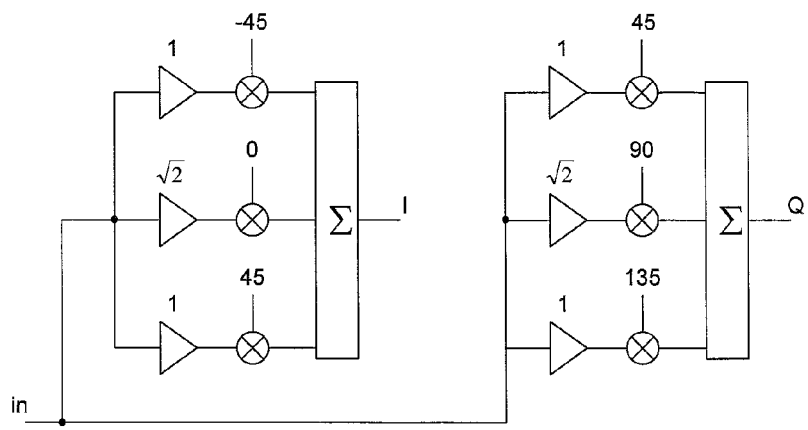
Figure 11:
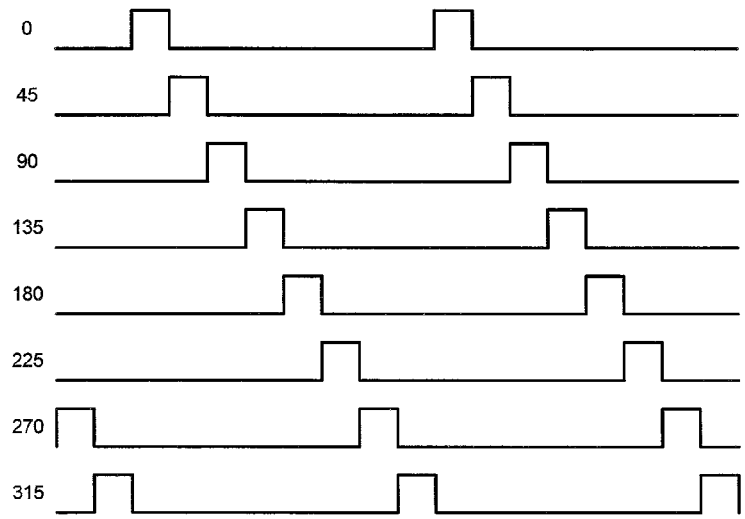
Figure 12:
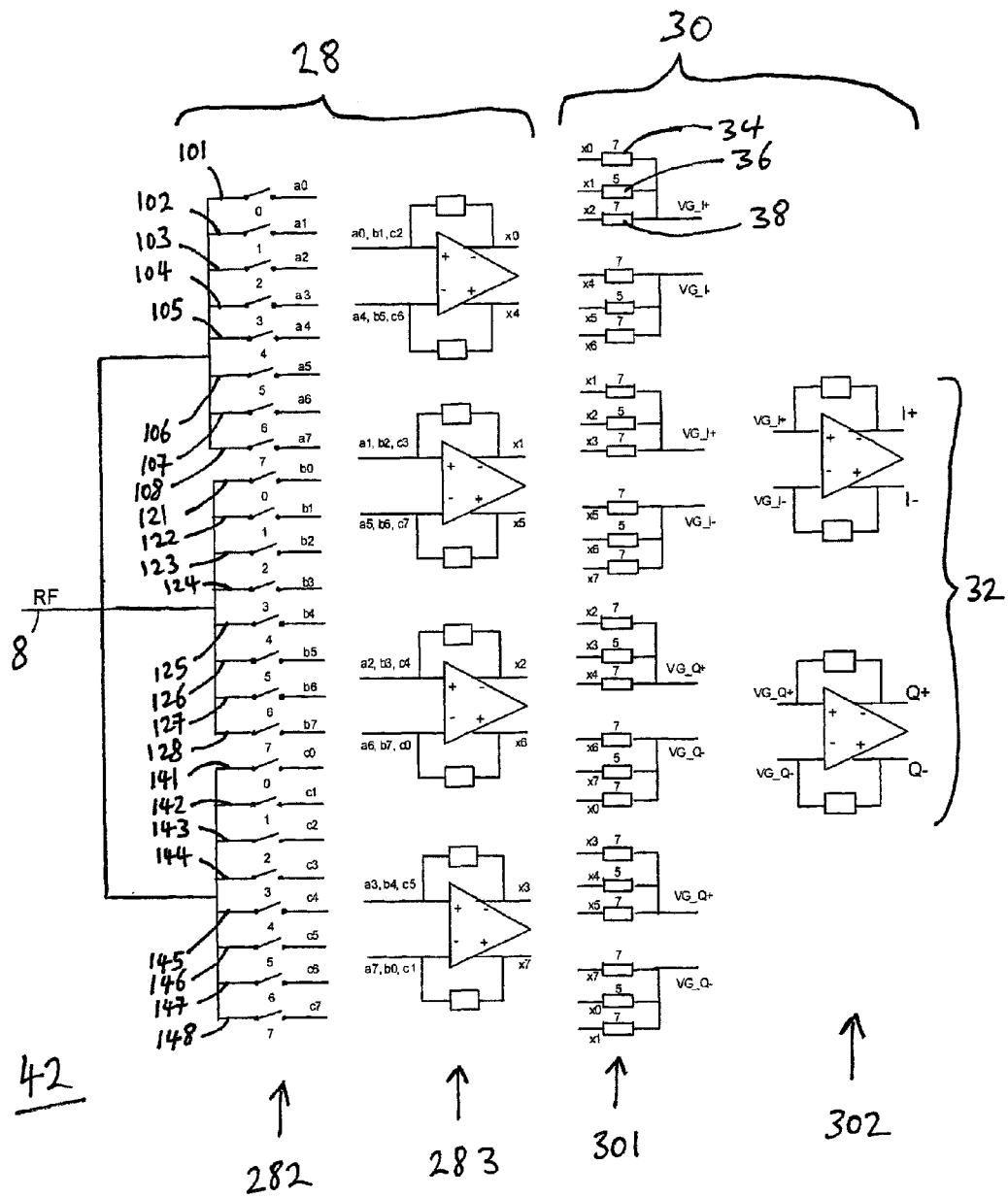
Figure 13:
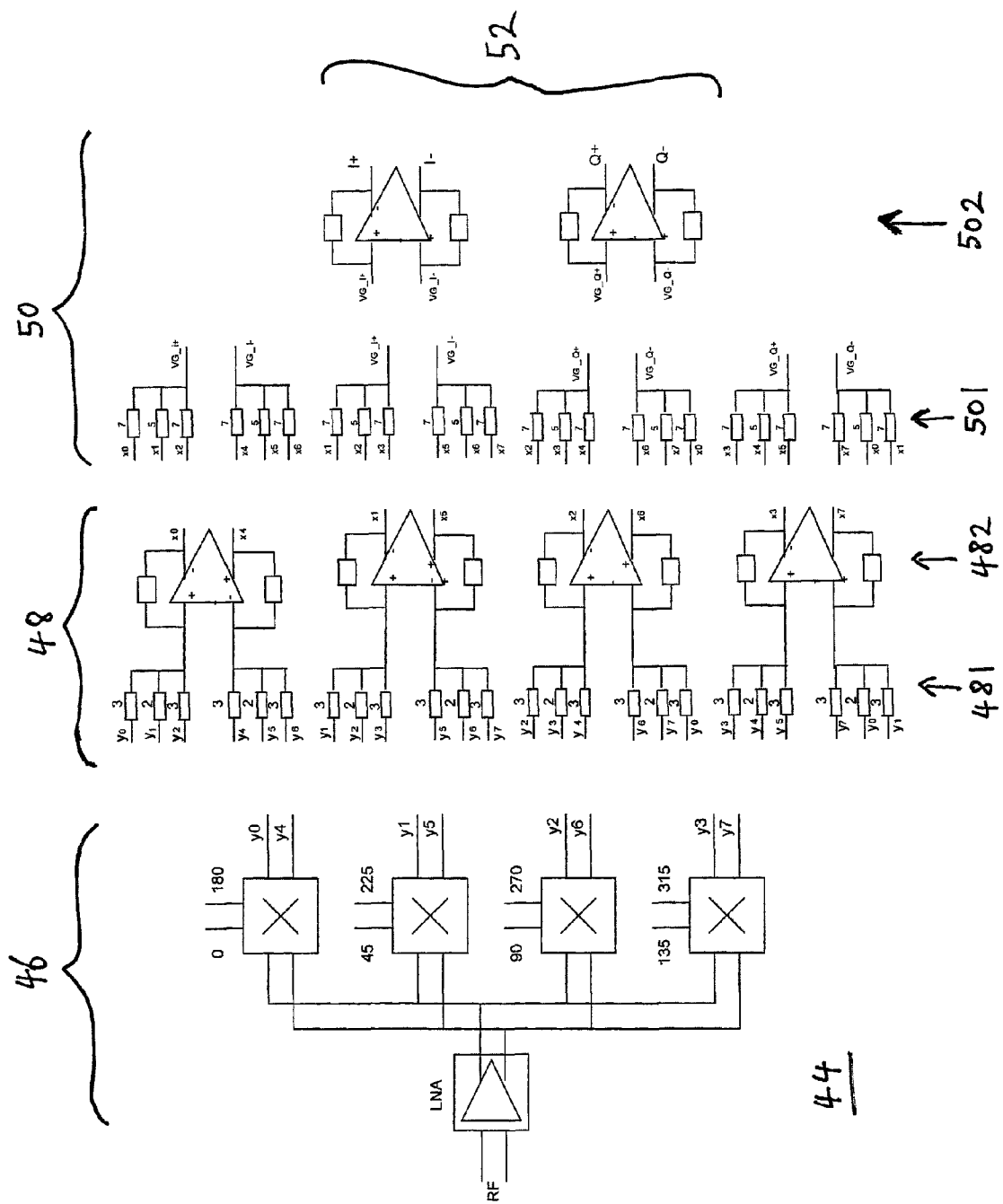

FIG. 10 schematically illustrates a complex implementation of a conventional HR mixer that requires four LO phases;

FIG. 11 schematically shows the 8 phased LO waveforms with 12.5% duty cycle used by HR mixer circuits of FIG. 9 and FIG. 12;

FIG. 12 is a schematic illustration of a further embodiment of a multi-stage polyphase HR mixer;

FIG. 13 is a schematic illustration of a further embodiment of a multi-stage polyphase HR mixer.

Figure 14:
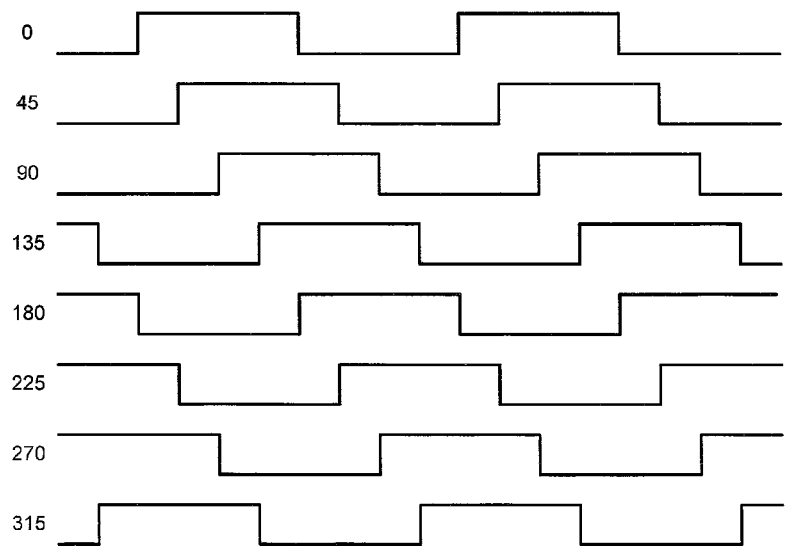
Figure 15:
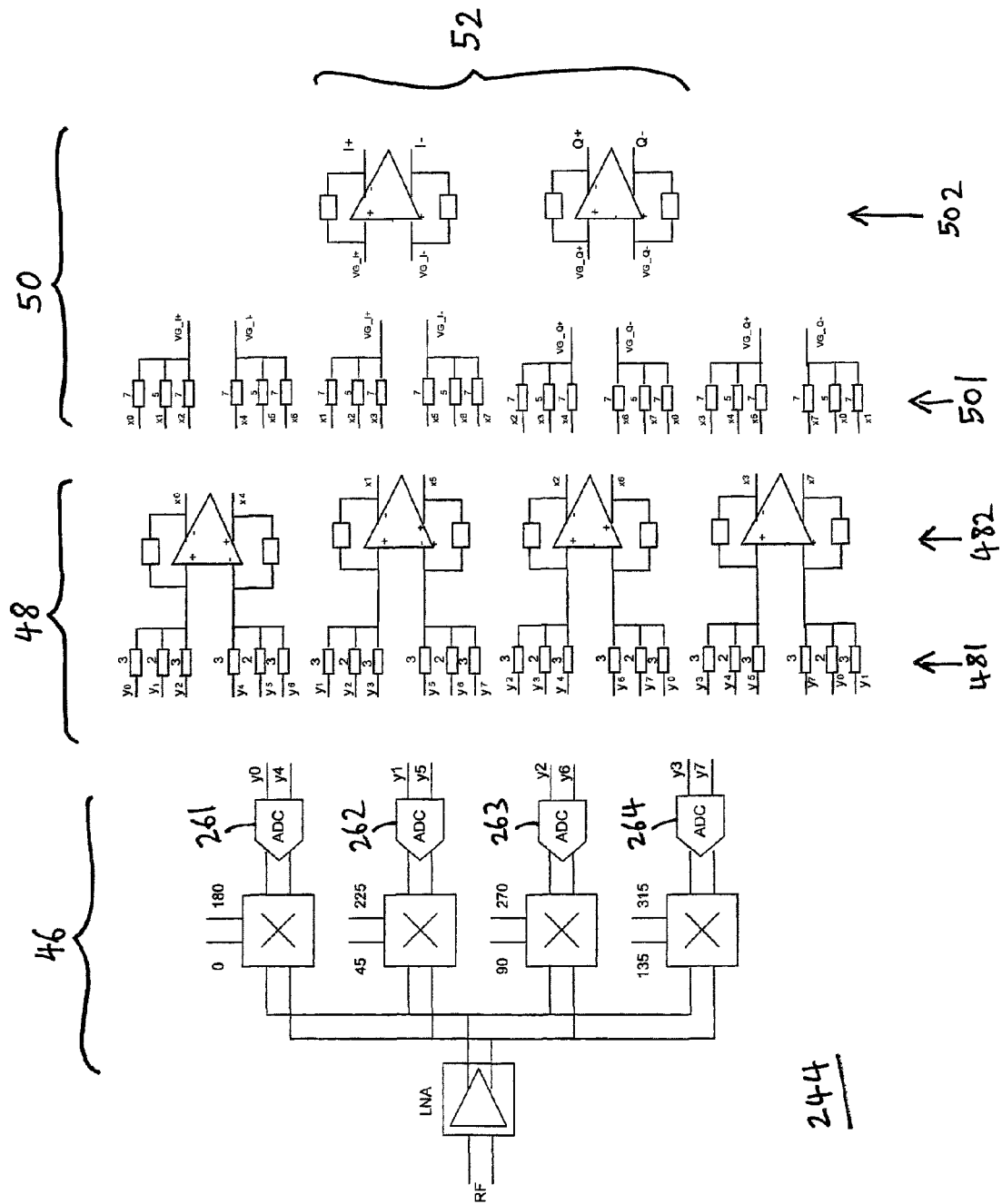

FIG. 14 schematically shows the 8 phased LO waveforms with 50% duty cycle used by HR mixer circuits of FIG. 13 and FIG. 15; and FIG. 15 a schematic illustration of a further embodiment of a multi-stage polyphase HR mixer.

Figure 5:
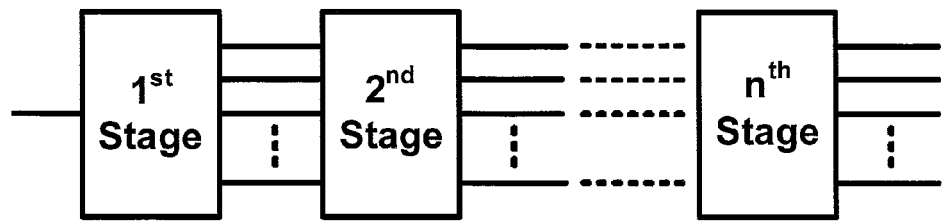
FIG. 5 shows a general block diagram of an HR mixer having multiple stages.
Figure 6:
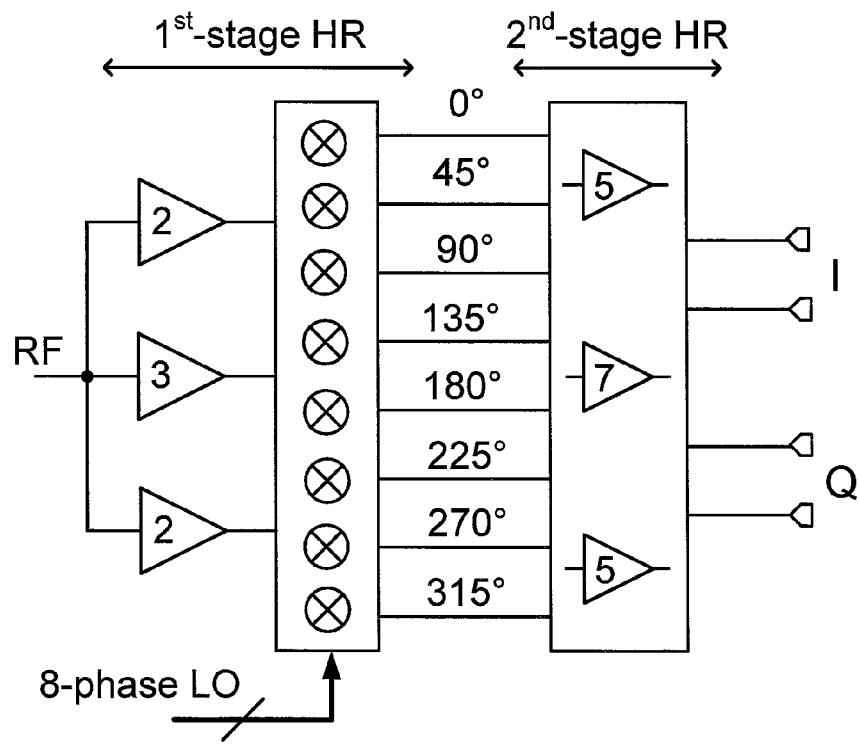
FIG. 6 shows an example of two-stage polyphase HR mixer.

The present invention provides a multi-stage polyphase harmonic rejection mixer that tends to reduce susceptibility to gain mismatch, for example as shown in FIG. 5. Another example is a two-stage polyphase HR mixer, as shown in FIG. 6. This mixer suppresses the 3rd and 5th harmonics.

To achieve high HRR requires the accurate implementation of the desired weighting ratios, in this case the irrational ratio 1:√2:1. The weighting ratios need be sufficiently close to their nominal (average) value and the effect of component mismatch on the weighting ratio needs to be sufficiently small. Both aspects are addressed by a two-stage polyphase HR concept. By distributing weighting and combining over 2 stages, FIG. 6, a much higher HRR can be achieved than with traditional HR mixers using only one stage.

Figure 7:
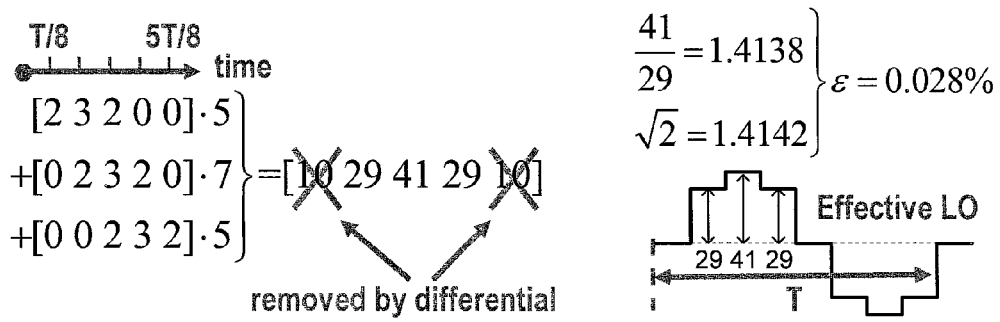
FIG. 7 shows the weighting factors for the 8-phase outputs of the first-stage HR versus time (t) for one complete period of the LO (T)

FIG. 6 shows the block diagram of the two-stage polyphase HR mixer driven from an 8-phase LO signal for frequency conversion. The irrational ratio 1:√2:1 is realized in two steps with integer ratios: a first step with 2:3:2 and a second step with 5:7:5. The 8-phase down conversion of the input RF signal in the first stage produces 8 IF output signals having equidistant phases, i.e., 0° to 315° with 45° step. This enables an iterative HR by adding a second stage that does a weighted combining of the 8-phase IF signal to the conventional I and Q quadrature differential outputs. To illustrate the operation further, FIG. 7 shows the weighting factor for the 8-phase outputs of the first-stage HR versus time (t) for one complete period of the LO signal (T). If each time three adjacent-phase outputs of the first-stage are weighted and combined by second-stage weighting factors 5:7:5, as shown in FIG. 8, we find overall weighting of 29:41:29.

Figure 8:
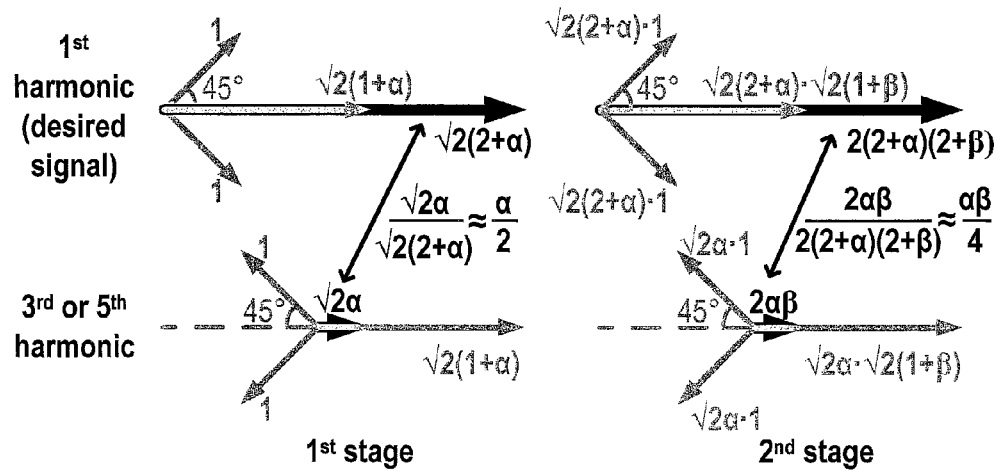
FIG. 8 is a schematic representation showing certain principles and outcomes of two-stage polyphase harmonic rejection.

FIG. 8 is a schematic representation showing certain principles and outcomes of the two-stage polyphase harmonic rejection. α and β are errors in √2 of the first stage and the second stage respectively, however the principles also apply to errors in 1:1 mismatch. The top part of FIG. 8 shows a calculation of how √2 is approximated to within 0.03% as 41:29 by simple integer 2:3:2 and 5:7:5 ratios. This 41:29 ratio in the effective LO amplitude is constructed via three signal paths, each with a weighting factor of the first stage (time-dependent factor 0, 2 or 3 in the array) and the second stage (constant 5 or 7). The bottom part of FIG. 8 shows how for the desired signal, polyphase contributions from three paths add up, while for the 3rd and 5th harmonics, they cancel nominally. As the two stages are cascaded, the product of the gains determines the result. This means that the total relative error $(\alpha\beta/4)$ is the product of the relative errors (first stage: $\alpha/2$, second stage: $\beta/2$). If the second stage has 1% error (n), this advantageously improves HR by $(\beta/2)^{-1}$, i.e. 46 dB compared to conventional arrangements.

For example, in tests on the above described complex two-stage polyphase HR mixer according to FIG. 6 implemented on a receiver test chip, the minimum 3rd HR ratio over 40 samples measured was 60 dB and 5th HR ratio 64 dB. All even-order HRR were found to be greater than 60 dB. As observed from multiple chips, the improvement from the first stage to the second stage is in the range of 20 dB to 40 dB for both 3rd and 5th harmonics.

FIG. 9 is a schematic illustration of an embodiment of a multi-stage polyphase HR mixer 6, more particularly a complex two-stage polyphase HR mixer 6. This embodiment tends to reduce susceptibility to gain mismatch. The two-stage polyphase HR mixer 6 tends to reduce the gain error (due to e.g. mismatch or parasitic effects) to a product of gain errors (e.g. two times 1% becomes 0.01%). Furthermore, a distribution of weighting over two stages is provided and this also allows use of simple integer ratios to accurately approximate irrational numbers.

Figure 1:
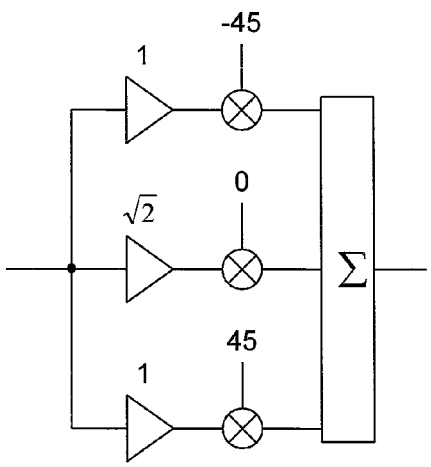
Figure 2:
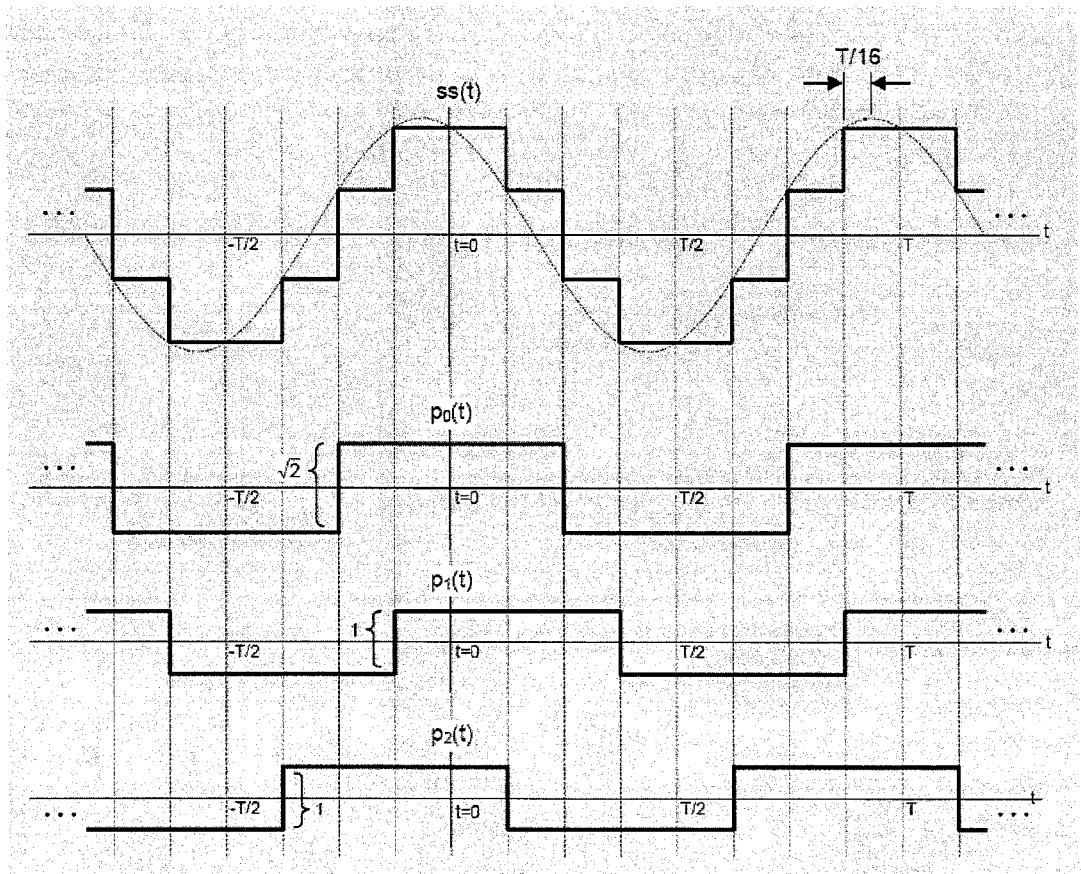
FIG. 2 shows an effective mixing waveform of a conventional HR mixer (3rd and 5th) created by a weighted addition of 3 hard-switching mixer outputs.
Figure 3:
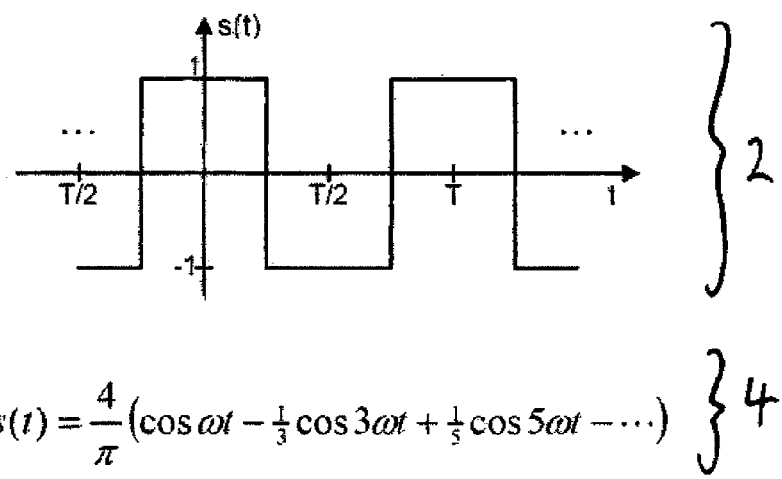
FIG. 3 shows a unity amplitude square wave and its frequency content.
Figure 4:
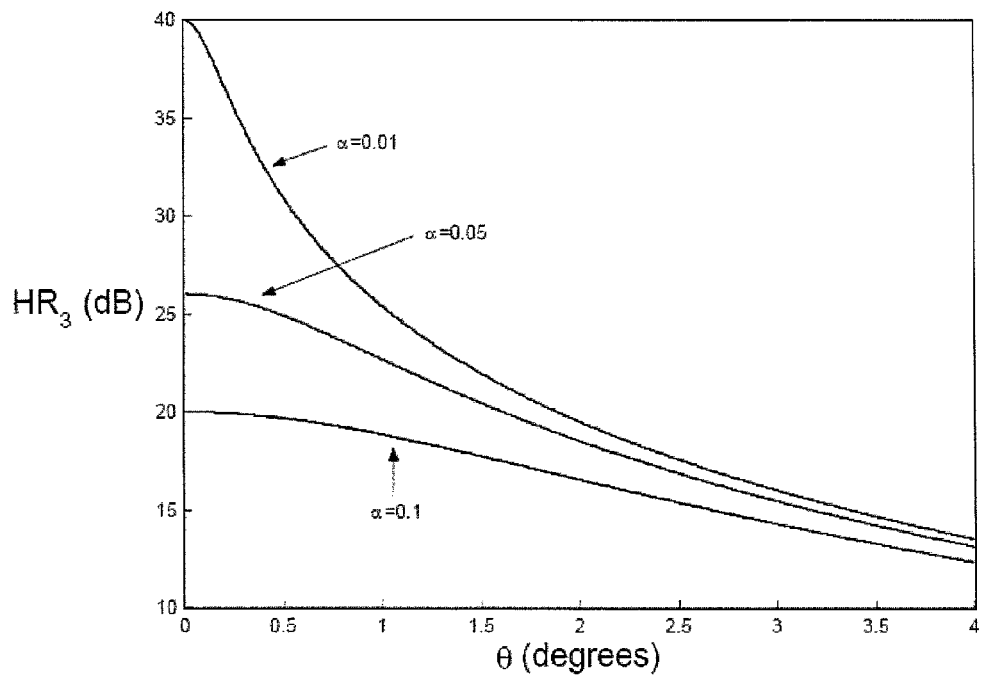
FIG. 4 shows third harmonic rejection as a function of gain and phase error applied to a signal p0.

To assist with understanding of this embodiment, let us first consider the following. FIGS. 1 and 10 schematically illustrate conventional HR mixers suppressing $3^{rd}$ and $5^{th}$ harmonics. The mixer shown in FIG. 1 needs three LO phases. The mixer shown in FIG. 10, which is a complex implementation, needs four LO phases (135 equals −45 inverted). If the mixer shown in FIG. 10 is implemented with balanced signals the number of LO phases increases to eight, four of which are unique and the other four can be derived by inversion of the first four LO signals. FIG. 9 shows an embodiment of a HR mixer according to the invention which achieves a corresponding functionality as the conventional HR mixer shown in FIG. 10. The new complex mixer also uses 8 LO phases to suppress the $3^{rd}$ and $5^{th}$ harmonics.

In FIG. 9, the complex two-stage polyphase HR mixer 6 comprises a first stage 28. A single-ended input RF signal 8 is input to the first stage 28. The first stage 28 is a selective weighting, frequency conversion and combining stage. The selective weighting 281 is implemented as three single-ended gain blocks 10, 12, 14. The frequency conversion 282 is implemented by mixers 101-108; 121-128; 141-148. Each single-ended gain block 10, 12, 14 drives a respective eight mixers 101-108; 121-128; 141-148, i.e. the first single-ended gain block 10 drives a first set of eight mixers 101-108, the second single-ended gain block 12 drives a second set of eight mixers 121-128, and the third single-ended gain block 14 drives a third set of eight mixers 141-148. Such a set of eight mixers can be driven from a single amplifier as the duty cycle of the LO signal is ⅛, as shown schematically in FIG. 11, where FIG. 11 schematically shows the LO waveforms for the eight phases. The combining 283 reduces the 24 phased mixer signals to 8 phased signals. The 3×8 single ended mixers share the same 8 LO signals so there are 24 output signals with 8 different phases.

The complex two-stage polyphase HR mixer 6 further comprises a second stage 30. The second stage 30 is a selective weighting and combining stage. The second stage 30 follows the first stage 28. The selective weighting 301 is implemented by resistors. The combining 302 reduces the signals from eight to four phases to output a complex differential down converted RF signal, the output location being indicated in FIG. 9 by reference numeral 32. The eight phases provided by the first stage 28 create the amount of phase signals needed for the signal recombination in the second stage 30 so as to achieve a second order gain mismatch reduction.

The first stage 28 uses a gain-ratio of 2:3:2. The second stage 30 uses a gain-ratio of 5:7:5 (via resistor ratios 7:5:7 of which one set of resistors of resistor value ratio 7:5:7 are indicated by way of example by reference numerals 34, 36, 38 in FIG. 9). The 45° phase shift comes from the eight-phase first stage down converted signal. An advantage offered by this embodiment is that the integer weighting ratios are more easily realized on a chip than the irrational number $\sqrt{2}$ required by the conventional HR mixer.

In overview, in this embodiment the HR mixer generates N signals with 360/N phase difference due to the differences in LO-phase. These N signals are weighted and combined to obtain again N phases (with harmonic rejection). This is done in the combining part 283 of the first stage 28 (but could also be implemented differently if voltage mixers are used). The weighting 301 and the combining 302 of the second stage 30 (5:7:5 resistors and second amplifier stage) repeats this process. In general this stage again produces N signals with 360/N phase difference and the weighting and combining can be repeated.

In the above described embodiment, the complex two-stage polyphase HR mixer 6 uses an eight phase LO (suppressing the 3rd and 5th harmonics besides all even-order harmonics). However, this need not be the case, and in other embodiments the complex two-stage polyphase HR may be implemented for other number of phases, e.g. if another number of harmonics needs to be suppressed.

In the above described embodiment, the complex two-stage polyphase HR mixer 6 operates from a ⅛ duty cycle LO signal. However, this need not be the case, and in other embodiments other duty cycle values may be used.

In the above described embodiment, the input RF signal is a single-ended input RF signal 8. However, this need not be the case, and in other embodiments the input RF signal may be fully differential instead of single-ended.

In the above described embodiment, mixers are used to implement the frequency conversion. However, this need not be the case, and in other embodiments frequency conversion may be implemented using techniques other than mixers, for example samplers.

In the above described embodiment, transimpedance type of elements is used to implement the combining. However, this need not be the case, and in other embodiments combining may be implemented using techniques other than transimpedance, for example resistance or digital blocks.

In the above described embodiment, transconductance and resistance type of elements are used to implement the weighting. However, this need not be the case, and in other embodiments weighting may be implemented using techniques other than resistance or transconductance, for example inductors, capacitors, switched capacitor elements, or digital blocks.

In the above described embodiment weighting ratios of 2:3:2 and 5:7:5 are used. However, this need not be the case, and in other embodiments other weighting ratios may be used, including equal weighting ratios, e.g. 1:1:1.

In the above described embodiment, the second stage reduces the signals from eight to four phases to output a complex differential down converted signal. However, this need not be the case, and in other embodiments the second stage output may keep the same number of phases as the first stage output (e.g. for repeated weighted combining).

In the above described embodiment, two stages are provided in the polyphase HR such that two stages of polyphase signal selective weighting are combined. However, in other embodiments, yet more stages may be provided in the polyphase HR such that yet more stages of polyphase signal selective weighting are combined. For example, a polyphase HR with three stages may be provided. Thus, the various embodiments may generally be referred to as providing a multi-stage polyphase HR, i.e. not only two-stage ones.

In other embodiments numbers of phases other than 8 may be used, for example 16 phases.

The embodiments described use analog circuits to implement the selective combining of multi phased output signals. Instead, each of the mixer output signals may be applied to a respective Analog to Digital Converter and the further signal processing of selective weighting and combining implemented in the digital domain. An embodiment in which this is implemented is described later below with reference to FIG. 15.

The above described embodiments of a complex polyphase HR mixer may be used in any mixer that uses or requires HR, i.e. any appropriate application, device or system. Examples include wide band broadcast receivers (TV), software defined radio, indeed any transceiver or other device requiring a harmonic rejection mixer. In particular, when used in a mixer that directly interfaces an antenna (e.g. a so-called LNA-less receiver), the two-stage (or other numbers of stages) approach offers benefit in that the influence of the varying antenna impedance on HR will tend to be strongly reduced.

Another advantage that tends to be provided, and mentioned in passing earlier above, is that the two-stage HR approach reduces the gain error (due to e.g. mismatch or parasitic effects) to a product of gain errors (e.g. 1% times 1% becomes 0.01%). The distribution of selective weighting over two stages also allows use of integer ratios to accurately approximate irrational numbers. These advantages also tend to apply to those embodiments with more than two stages.

FIG. 12 is a schematic illustration of a further embodiment of a multi-stage polyphase HR mixer 42, more particularly a complex two-stage polyphase HR mixer 42. The HR mixer 42 is the same as the HR mixer 6 described above with reference to FIG. 9, except that the selective weighting 281 of the first stage 28 is omitted (i.e. the three single-ended gain blocks 10, 12, 14 are omitted). The same reference numerals as used in FIG. 9 are used again to indicate the same elements. Thus in this embodiment the first stage 28 is a frequency conversion and combining stage. This embodiment is particularly advantageous for LNA-less receivers.

FIG. 13 is a schematic illustration of a further embodiment of a multi-stage polyphase HR mixer 44, more particularly a complex three-stage polyphase HR mixer 44. The HR mixer 44 has balanced signals and mixers operating from 50% duty cycle LO signals. FIG. 14 schematically shows the LO waveforms for the eight phases. The first stage 46 is a frequency conversion stage, more particularly a multi-phase frequency conversion stage. The second stage 48 is a selective weighting and combining stage, and follows the first stage 46. The selective weighting 481 of the second stage 48 is implemented by resistors. The combining 482 of the second stage 48 reduces the phases from 24 to 8. The third stage 50 is a further selective weighting and combining stage, and follows the second stage 48. The selective weighting 501 of the third stage 50 is implemented by resistors. The combining 502 of the third stage 50 reduces the signals from eight to four phases to output a complex differential frequency converted signal, the output location being indicated in FIG. 13 by reference numeral 52.

Compared to this HR mixer 44 described with reference to FIG. 13, the HR mixer 6 described earlier above with reference to FIG. 9 may be considered as an embodiment which saves components over the HR mixer 44, by introducing single ended mixers (driven with non-overlapping 12.5% duty cycle LO signals), moving the first stage weighting to the RF domain and, as a result, featuring a simplified first stage combining of mixer output currents in a low input impedance amplifier.

FIG. 15 is a schematic illustration of a further embodiment of a multi-stage polyphase HR mixer 244, more particularly a complex three-stage polyphase HR mixer 244. The HR mixer 244 is the same as the HR mixer 44 described above with reference to FIG. 13, except that digital circuits are used to implement the selective combining of multi phased output signals in the second stage 48 and the third stage 50, i.e. the second stage 48 and the third stage 50 are implemented in the form of digital circuitry. Each of the mixer output signals of the first stage 46 are applied to a respective Analog to Digital Converter 261, 262, 263, 264. The same reference numerals as used in FIG. 13 are used again to indicate the same elements.

In each of the above embodiments, more than two signals are weighted and combined.

The invention claimed is:

1. A polyphase harmonic rejection mixer, comprising:
a plurality of stages following each other, the plurality of stages including:
a first stage configured and arranged to perform at least frequency conversion; and
a second stage configured and arranged to perform at least selective weighting and combining;
wherein at least two of the plurality of stages are configured and arranged to perform at least combining; and
further comprising at least one further stage, each said further stage being configured and arranged to perform selective weighting and combining 2. A polyphase harmonic rejection mixer according to claim 1, wherein the first stage is further configured and arranged to perform combining in addition to frequency conversion.

3. A polyphase harmonic rejection mixer according to claim 2, wherein the first stage is further configured and arranged to perform selective weighting in addition to frequency conversion and combining 4. A polyphase harmonic rejection mixer claim 1, wherein a following stage is configured and arranged to reduce a number of phases output by its preceding stage.

5. A polyphase harmonic rejection mixer according to claim 1, wherein a final stage is configured and arranged to output a complex differential down converted signal.

6. A polyphase harmonic rejection mixer according to claim 1, wherein the selective weighting in at least one of the stages is implemented by one of resistance, transconductance, and digital blocks.

7. A polyphase harmonic rejection mixer according to claim 6, wherein the selective weighting in at least one stage is implemented by plural gain blocks.

8. A polyphase harmonic rejection mixer according to claim 7, wherein the gain blocks are single-ended.

9. A polyphase harmonic rejection mixer according to claim 7, wherein each said gain block drives a respective set of plural mixers or samplers.

10. An LNA-less receiver comprising an antenna directly interfaced to a polyphase harmonic rejection mixer according to claim 1.

11. A software-defined radio comprising a polyphase harmonic rejection mixer according to claim 1.

12. A method of configuring a polyphase harmonic rejection mixer, the method comprising:
using a first stage of a plurality of stages, performing at least frequency conversion;
using a second stage of the plurality of stages, performing at least selective weighting and combining;
perform at least combining using at least two stages of the plurality of stages; and
using at least one further stage of the plurality of stages, performing selective weighting and combining.

13. The method according to claim 12, further comprising, using a following stage of the plurality of stages, reducing a number of phases output by a preceding one of the plurality of stages.

14. A polyphase harmonic rejection mixer, comprising a plurality of stages arranged in a pipeline and including:
a first stage configured and arranged to perform down conversion of an radio frequency (RF) signal to provide a first plurality of intermediate frequency (IF) signals having equidistant phases, the first plurality including a number (X) of IF signals;
a second stage coupled to an output of the first stage and configured and arranged to perform selective weighting of the first plurality of IF signals, and perform combining of the first plurality of IF signals to provide a second plurality of IF signals, the second plurality including a number (Y) of IF signals, where Y<X; and
a third stage coupled to an output of the second stage and configured and arranged to perform selective weighting of the second plurality of IF signals, and perform combining of the second plurality of IF signals to provide a third plurality of IF signals, the third plurality including a number (Z) of IF signals, where Z<Y.

15. A polyphase harmonic rejection mixer according to claim 14, wherein a final stage in the pipeline is configured and arranged to output a complex differential signal having four phases.

16. A polyphase harmonic rejection mixer according to claim 14, wherein:
the first plurality of IF signals includes 24 IF signals (X=24);
the second plurality of IF signals includes 8 IF signals (Y=8); and
the third plurality of IF signals includes 4 IF signals (Z=4).

* * * * *